(12) United States Patent
Takeguchi et al.

(10) Patent No.: US 9,952,512 B2
(45) Date of Patent: Apr. 24, 2018

(54) DEVELOPING METHOD, DEVELOPING APPARATUS, AND COMPUTER-READABLE STORAGE MEDIUM

(71) Applicant: TOKYO ELECTRON LIMITED, Tokyo (JP)

(72) Inventors: Hirofumi Takeguchi, Koshi (JP); Tomohiro Iseki, Koshi (JP); Yuichi Terashita, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 182 days.

(21) Appl. No.: 14/704,200

(22) Filed: May 5, 2015

(65) Prior Publication Data

US 2015/0362839 A1 Dec. 17, 2015

(30) Foreign Application Priority Data

Jun. 17, 2014 (JP) ................................. 2014-124158

(51) Int. Cl.

| | | |
|---|---|---|
| *B05D 3/12* | (2006.01) | |
| *G03F 7/32* | (2006.01) | |
| *G03F 7/16* | (2006.01) | |
| *B05D 1/00* | (2006.01) | |
| *H01L 21/67* | (2006.01) | |

(52) U.S. Cl.
CPC ............... *G03F 7/32* (2013.01); *G03F 7/162* (2013.01); *B05D 1/005* (2013.01); *H01L 21/6715* (2013.01)

(58) Field of Classification Search
CPC ........... B05D 1/005; G03F 7/32; G03F 7/162; H01L 21/7615; H01L 21/6715

USPC ........................................................ 427/240
See application file for complete search history.

(56) References Cited

U.S. PATENT DOCUMENTS 6,602,382 B1    8/2003   Matsuyama et al.
9,059,221 B2 *   6/2015   Goto ................ H01L 21/02057
(Continued)

FOREIGN PATENT DOCUMENTS

JP          10-041209 A1     2/1998
JP     2000-173906 A1     6/2000
(Continued)

OTHER PUBLICATIONS

Japanese Office Action (Application No. 2014-124158) dated Jan. 31, 2017 (with English translation).

*Primary Examiner* — Kirsten Jolley
(74) *Attorney, Agent, or Firm* — Burr & Brown, PLLC

(57) ABSTRACT

A developing method for forming a resist film having a high uniformity of CD distribution. After exposure of a resist film on a substrate surface to form a resist pattern, the method includes sequential steps of: (A) supplying a developer to the rotating substrate; (B) reacting the resist film with the developer; and (C) removing the developer from the surface of the resist film to terminate the reaction of the resist film with the developer. In step (A), a liquid-contact nozzle, having an ejection orifice for the developer and a lower surface extending laterally from the ejection orifice and disposed opposite the resist film, is used. In step (C), the boundary between a reaction-terminated area of the surface of the resist film, and an in-progress reaction area of the surface of the resist film, is moved from the center toward the periphery of the resist film.

7 Claims, 13 Drawing Sheets

(56) References Cited

U.S. PATENT DOCUMENTS

| | | | |
|---|---|---|---|
| 2006/0048792 A1* | 3/2006 | Nakamura | B08B 3/02 |
| | | | 134/2 |
| 2007/0116459 A1 | 5/2007 | Takeguchi et al. | |
| 2007/0183775 A1* | 8/2007 | Mitsuhashi | G03F 7/3021 |
| | | | 396/611 |
| 2011/0096304 A1 | 4/2011 | Takeguchi et al. | |
| 2012/0006361 A1* | 1/2012 | Miyagi | H01L 21/67028 |
| | | | 134/30 |
| 2012/0073609 A1 | 3/2012 | Hashimoto et al. | |

FOREIGN PATENT DOCUMENTS

| | | |
|---|---|---|
| JP | 3614769 B2 | 1/2005 |
| JP | 2005-268320 A1 | 9/2005 |
| JP | 2007-134516 A1 | 5/2007 |
| JP | 2009-004597 A1 | 1/2009 |
| JP | 2009-111219 A1 | 5/2009 |
| JP | 4893799 B2 | 3/2012 |
| JP | 2012-074589 A1 | 4/2012 |

\* cited by examiner

DEVELOPING METHOD, DEVELOPING APPARATUS, AND COMPUTER-READABLE STORAGE MEDIUM

CROSS-REFERENCE TO RELATED APPLICATION

This application claims the priority benefit of Japanese Patent Application No. 2014-124158, filed on Jun. 17, 2014, the disclosure of which is incorporated herein by reference in its entirety.

TECHNICAL FIELD

The present invention relates to a method for developing a resist film after exposure, a developing apparatus, and a computer-readable storage medium for use in the developing apparatus.

BACKGROUND ART

Forming a three-dimensional pattern on a substrate (e.g. a semiconductor wafer) by using a photolithography technique is widely practiced these days in performing fine processing of the substrate. For example, a process for forming a resist pattern on a semiconductor wafer comprises forming a resist film on a surface of the semiconductor wafer, exposing the resist film along a predetermined pattern, and developing the resist film after exposure by reacting it with a developer.

A variety of developing techniques have heretofore been developed. For example, patent document 1 discloses a developing method which involves forming a puddle of a developer on a stationary substrate. A long nozzle having an ejection orifice(s) is used for the formation of the puddle: the developer is applied onto the entire surface of the resist film on the substrate by ejecting the developer from the ejection orifice(s) while moving the nozzle from one end to the opposite end of the substrate. For convenience sake, such a developing method is herein referred to as a "stationary developing method".

Patent document 2 discloses a developing method in which a developer is supplied onto a rotating substrate. The developer is ejected toward the substrate from an ejection orifice of a nozzle while moving the nozzle in the radial direction of the substrate. A liquid film of the developer is formed on a resist film by the action of centrifugal force due to the rotation of the substrate and by the movement of the developer supply position. For convenience sake, such a developing method, in which a developer is supplied onto a rotating substrate, is herein referred to as a "rotary developing method". Patent document 3 discloses an exemplary developing method which is classified as a rotary developing method. In particular, the method of patent document 3 uses a nozzle having a lower-end surface and disposed such that the lower-end surfaces faces an area of a wafer, the area including the axis of rotation of the wafer. A liquid is supplied from the nozzle onto the rotating wafer while the gap between the wafer and the lower-end surface of the nozzle is kept filled with the liquid. The liquid spreads outwardly on the wafer due to centrifugal force.

PRIOR ART DOCUMENTS

Patent Documents

Patent document 1: Japanese Patent No. 3614769
Patent document 2: Japanese Patent No. 4893799
Patent document 3: Japanese Patent Laid-Open Publication No. 2012-74589

SUMMARY OF THE INVENTION

In the case of the conventional stationary developing method, convection of a developer is unlikely to occur in a puddle of the developer, whereby the developer whose reactivity has decreased due to a reaction with a resist film is likely to reside for a period. Therefore, the conventional stationary developing method requires a relatively long developing time and has room for improvement in this regard. On the other hand, in the case of the conventional rotary developing method, a developer that has been supplied onto a substrate flows on the substrate. The flow of the developer can result in a non-uniform width (critical dimension, hereinafter referred to as "CD") of a resist line. The conventional rotary developing method thus has room for improvement in this regard.

It is therefore an object of the present invention to provide a developing method which can form a resist having a sufficiently high uniformity of CD distribution. It is another object of the present invention to provide a developing apparatus which can perform the developing method, and a computer-readable storage medium for use in the developing apparatus.

In order to achieve the objects, the present invention provides a developing method for developing a resist film after exposure on a substrate surface to form a resist pattern, said method comprising the sequential steps of: (A) supplying a developer to the rotating substrate held in a horizontal position, thereby allowing the developer to spread over the surface of the resist film; (B) reacting the resist film with the developer; and (C) removing the developer from the surface of the resist film to terminate the reaction of the resist film with the developer, wherein in the step (A), a liquid-contact nozzle, having an ejection orifice for the developer and a lower surface extending laterally from the ejection orifice and disposed opposite the resist film, is used, and the developer is supplied from the ejection orifice to the gap formed between the surface of the resist film and the lower surface of the liquid-contact nozzle while moving the liquid-contact nozzle in a direction from the center toward the periphery of the rotating substrate, and wherein in the step (C), the boundary between a reaction-terminated area of the surface of the resist film, from which the developer has been removed, and an in-progress reaction area of the surface of the resist film, where the reaction of the resist film with the developer is in progress, is moved from the center toward the periphery of the resist film.

By using the liquid-contact nozzle and moving the liquid-contact nozzle in a direction from the center toward the periphery of the rotating substrate in the step (A), the movement speed of the developer spreading over the resist film can be sufficiently controlled. In the step (C) after the step (B), the boundary between the reaction-terminated area of the surface of the resist film and the in-progress reaction area of the surface of the resist film is moved from the center toward the periphery of the resist film. This makes it possible to make small the difference in developing time between the center and the periphery of the resist film, thereby sufficiently reducing the non-uniformity of CD distribution due to the difference in developing time. The developing method may comprise an additional step(s) before the step (A), between the respective steps and/or after the step (C).

The rotational speed of the substrate in the step (A) is preferably low (e.g. 5 to 100 rpm). This makes it possible to more accurately control the flow speed of the developer spreading over the resist film. On the other hand, the substrate is preferably rotated at a high speed (e.g. 1000 to 5000 rpm) when forming the reaction-terminated area at the center of the resist film in the step (C). Further, it is preferred to decrease the rotational speed of the substrate as the boundary between the reaction-terminated area and the in-progress reaction area moves toward the periphery of the substrate. By rotating the substrate at a high speed, centrifugal force that moves the developer outwardly from the center of the substrate can be generated. The centrifugal force applied to the developer increases as the reaction-terminated area expands outward. Therefore, the rotational speed of the substrate may be decreased. The rotational speed of the substrate may be decreased either continuously or stepwise.

The speed of the liquid-contact nozzle moving in the radial direction of the substrate in the step (A) is preferably in the range of 5 to 100 mm/sec, and the speed of the boundary moving in the radial direction of the substrate in the step (C) is preferably in the range of 5 to 100 mm/sec. The difference in developing time between the center and the periphery of the resist film can be made sufficiently small by making the speed of radial movement of the liquid-contact nozzle as close to the speed of radial movement of the boundary as possible. This makes it possible to further enhance the uniformity of CD distribution in the resist film.

The following methods may be used to form the reaction-terminated area (to remove the developer) from the center toward the periphery of the resist film in the step (C):

supplying a drying gas to the center of the resist film from above;

supplying a rinsing liquid from the center toward the periphery of the resist film; and sucking up the developer on the resist film through a suction nozzle moving in a direction from the center toward the periphery of the resist film.

A common nozzle (e.g. a straight nozzle) or the above-described liquid-contact nozzle (having an ejection orifice for the developer and a lower surface extending laterally from the ejection orifice and disposed opposite the resist film) may be used to supply the rinsing liquid to the resist film.

In the step (C), a developer may be supplied onto the resist film from a nozzle moving in a direction from the center toward the periphery of the resist film. By supplying a developer from the moving nozzle onto the surface of the resist film, drying of the developer in the in-progress reaction area can be prevented. When such a nozzle is used, the position of the nozzle makes the boundary between the reaction-terminated area and the in-progress reaction area. Thus, the movement speed of the boundary can be controlled by controlling the movement speed of the nozzle.

The present invention also provides a developing apparatus for developing a resist film after exposure on a substrate surface to form a resist pattern, said apparatus comprising: a rotary holder for holding the substrate and rotating the substrate; a liquid-contact nozzle having an ejection orifice for a developer, and a lower surface extending laterally from the ejection orifice and disposed opposite the resist film; a replenishing developer supply nozzle for supplying a replenishing developer onto the surface of the substrate from above; a developer supply section for supplying the developer to the liquid-contact nozzle and the replenishing developer supply nozzle; and a drive section for moving the liquid-contact nozzle and the replenishing developer supply nozzle.

The developing apparatus having such a construction can perform the above developing method. The developing apparatus may be configured to be capable of supplying a rinsing liquid to the liquid-contact nozzle. According to such an apparatus, a rinsing liquid can be used to form the reaction-terminated area in the developing method, and the liquid-contact nozzle can be used to supply the rinsing liquid.

A computer-readable storage medium according to the present invention stores a program for causing a developing apparatus to perform the above developing method. The computer-readable storage medium herein includes a non-transitory computer recording medium (e.g. a main storage device or an auxiliary storage device) and a transitory computer recording medium (a propagated signal such as a data signal that can be provided via a network).

According to the present invention, there are provided a developing method which can form a resist having a sufficiently high uniformity of CD distribution, a developing apparatus which can perform the developing method, and a computer-readable storage medium for use in the developing apparatus.

DESCRIPTION OF THE PREFERRED EMBODIMENTS

Figure 1:
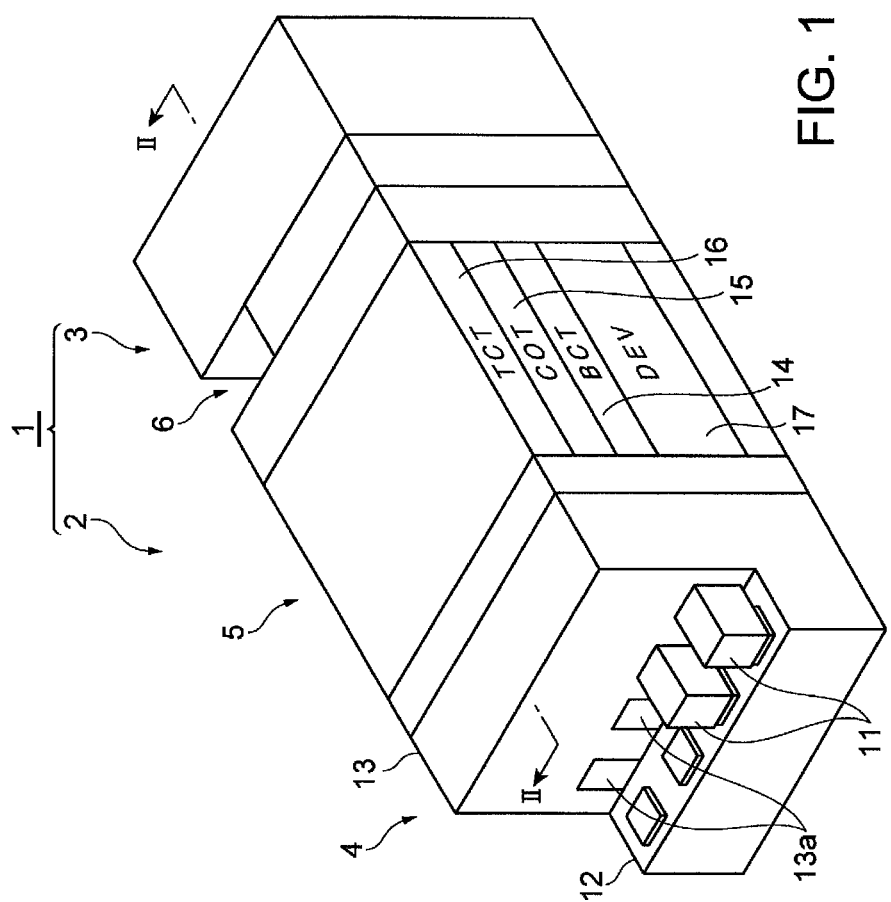
FIG. 1 is a perspective view of a substrate processing system.

Preferred embodiments of the present invention will now be described with reference to the drawings. The following embodiments merely illustrate the present invention and are not intended to limit it. In the following description and drawings, the same reference numerals are used to refer to the same or like members, components, elements, etc., and a duplicate description thereof will be omitted.

<Substrate Processing System>

A substrate processing system 1 includes a coating/developing apparatus 2 and an exposure apparatus 3. The exposure apparatus 3 performs exposure processing of a resist film. In particular, energy rays are applied to a target exposure area of the resist film (photosensitive film) e.g. by an immersion exposure method. Examples of the energy rays include ArF excimer laser, KrF excimer laser, g-rays, i-rays and EUV (Extreme Ultraviolet) rays.

The coating/developing apparatus 2 performs processing to form a resist film on the surface of a wafer W (substrate) prior to exposure processing by the exposure apparatus 3, and performs development of the resist film after the exposure processing. In this embodiment the wafer W has a disk-like shape; however, it is also possible to use a circular notched wafer or a wafer having a shape other than a circular shape, e.g., a polygonal shape. The wafer W may be a semiconductor substrate, a glass substrate, a mask substrate, an FPD (Flat Panel Display) substrate, or any other type of substrate.

Figure 2:
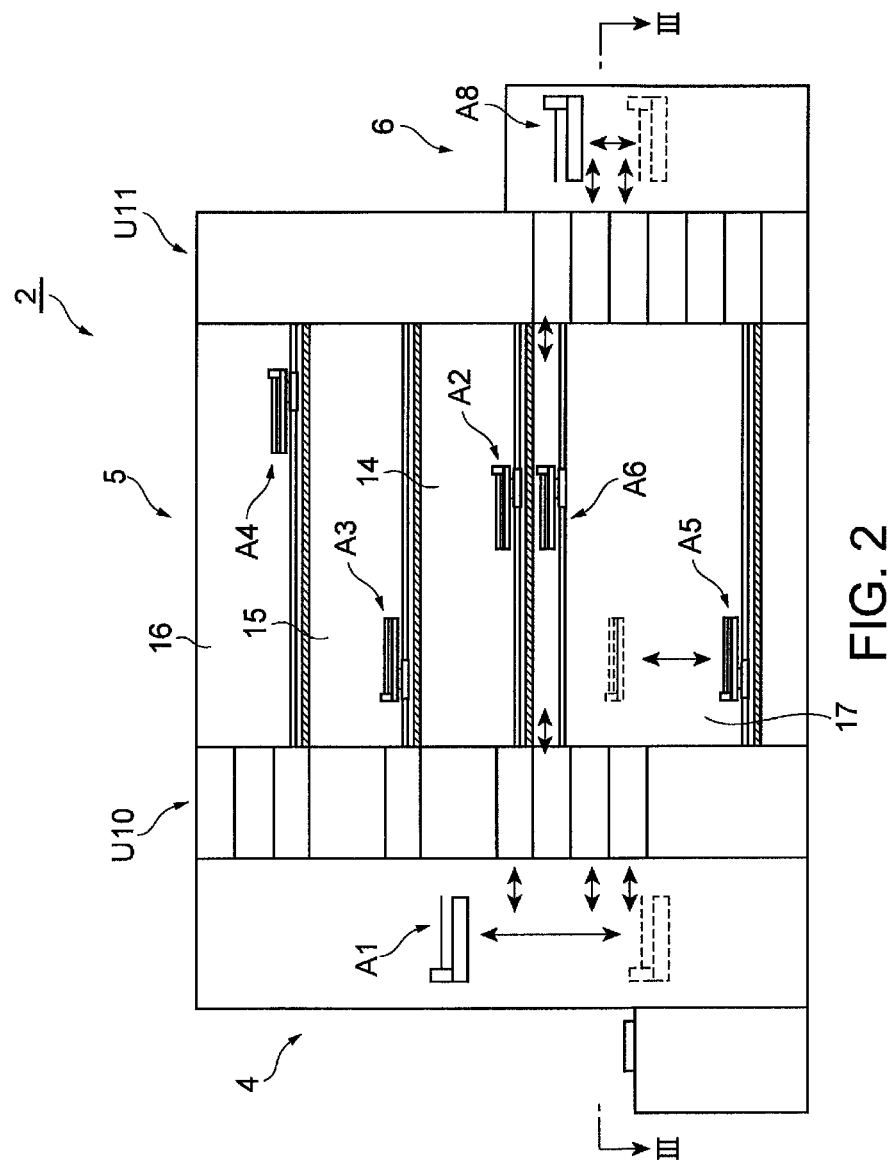
FIG. 2 is a cross-sectional view taken along the line II-II of FIG. 1.
Figure 3:
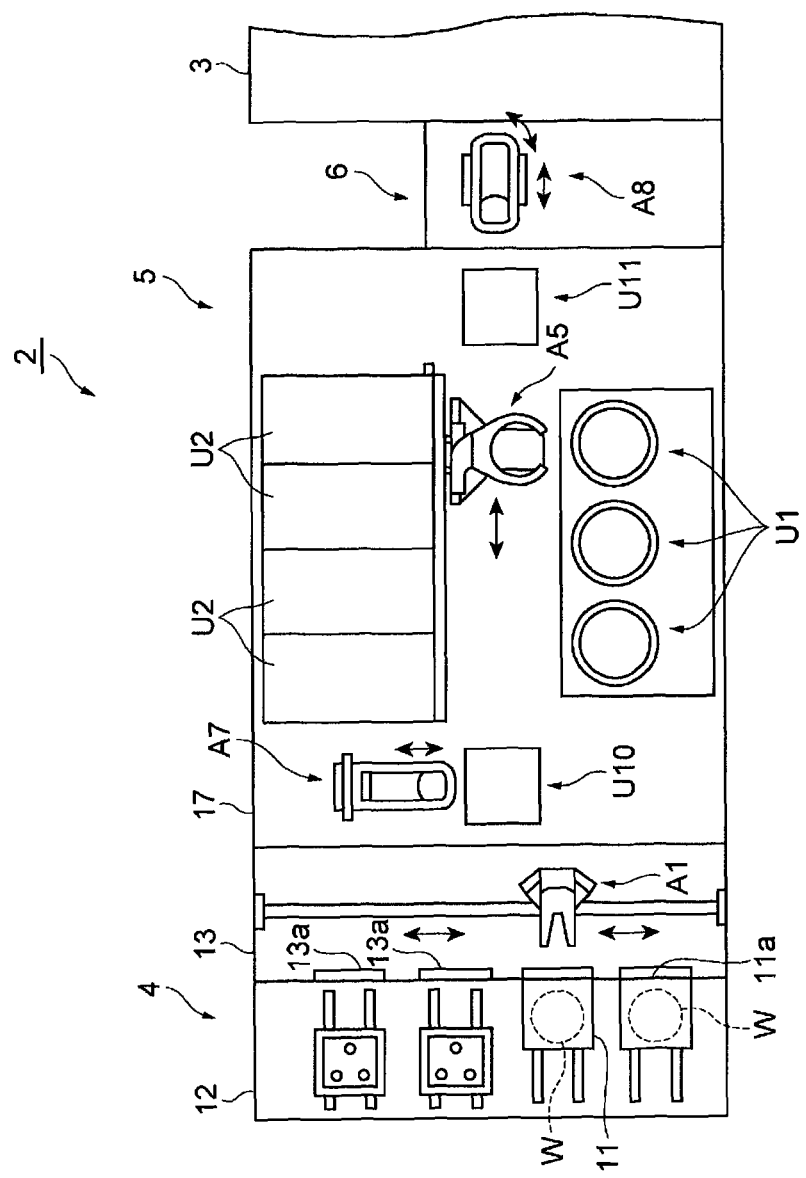
FIG. 3 is a cross-sectional view taken along the line III-III of FIG. 2.

As shown in FIGS. 1 through 3, the coating/developing apparatus 2 includes a carrier block 4, a processing block 5 and an interface block 6. The carrier block 4, the processing block 5 and the interface block 6 are arranged side-by-side in a horizontal direction.

The carrier block 4 includes a carrier station 12 and a carry-in/carry-out section 13. The carry-in/carry-out section 13 lies between the carrier station 12 and the processing block 5. The carrier station 12 supports a plurality of carriers 11. The carriers 11 each have, in one side 11a, an opening/closing door (not shown) for housing a plurality of wafers W, e.g. having a circular shape, in a hermetically-sealed state, and taking the wafers W in and out (see FIG. 3). The carriers 11 are detachably installed on the carrier station 12 with the sides 11a facing the carry-in/carry-out section 13. The carry-in/carry-out section 13 has opening/closing doors 13a corresponding to the carriers 11 on the carrier station 12. By simultaneously opening the opening/closing door in the side 11a of a carrier 11 and the corresponding opening/closing door 13a, the interior of the carrier 11 communicates with the interior of the carry-in/carry-out section 13. The carry-in/carry-out section 13 contains a transfer arm A1. The transfer arm A1 takes a wafer W out of a carrier 11 and transfers the wafer W to the processing block 5. Further, the transfer arm A1 receives a wafer W from the processing block 5 and returns the wafer W into the carrier 11.

The processing block 5 includes a lower film-forming (BCT) module 14, a resist film-forming (COT) module 15, an upper film-forming (TCT) module 16, and a developing (DEV) module 17. These modules are arranged in order of distance from the floor, as follows: the DEV module 17, the BCT module 14, the COT module 15 and the TCT module 16.

The BCT module 14 is configured to form a lower film on the surface of a wafer W. The BCT module 14 contains a plurality of coating units (not shown), a plurality of heat treatment units (not shown), and a transport arm A2 for transporting a wafer W to these units. The coating units are each configured to apply a lower film-forming processing liquid to the surface of a wafer W. The heat treatment units are each configured to perform heat treatment of a wafer W by heating the wafer W e.g. with a hot plate, and cooling the heated wafer W e.g. with a cooling plate. A heat treatment to cure the lower film of a wafer W is an exemplary heat treatment to be performed in the BCT module 14.

The COT module 15 is configured to form a thermosetting and photosensitive resist film on the lower film of a wafer W. The COT module 15 contains a plurality of coating units (not shown), a plurality of heat treatment units (not shown), and a transport arm A3 for transporting a wafer W to these units. The coating units are each configured to apply a resist film-forming processing liquid (resist solution) onto the lower film of a wafer W. The heat treatment units are each configured to perform heat treatment of a wafer W by heating the wafer W e.g. with a hot plate, and cooling the heated wafer W e.g. with a cooling plate. A PAB (Pre-Applied Bake) treatment to cure the resist film of a wafer W is an exemplary heat treatment to be performed in the COT module 15.

The TCT module 16 is configured to form an upper film on the resist film of a wafer W. The TCT module 16 contains a plurality of coating units (not shown), a plurality of heat treatment units (not shown), and a transport arm A4 for transporting a wafer W to these units. The coating units are each configured to apply an upper film-forming processing liquid to the surface of a wafer W. The heat treatment units are each configured to perform heat treatment of a wafer W by heating the wafer W e.g. with a hot plate, and cooling the heated wafer W e.g. with a cooling plate. A heat treatment to cure the upper film of a wafer W is an exemplary heat treatment to be performed in the TCT module 16.

The DEV module 17 is configured to perform development of a resist film after exposure. The DEV module 17 contains a plurality of developing units (developing apparatuses) U1, a plurality of heat treatment units U2, a transport arm A5 for transporting a wafer W to these units, and a direct transport arm A6 for transporting a wafer W without via the units (see FIGS. 2 and 3). The developing units U1 are each configured to partly remove a resist film to form a resist pattern. The heat treatment units U2 each perform heat treatment of a wafer W by heating the wafer W e.g. with a hot plate, and cooling the heated wafer W e.g. with a cooling plate. A PEB (Post-Exposure Bake) treatment before development or a PB (Post Bake) treatment after development is an exemplary heat treatment to be performed in the DEV module 17.

A shelf unit U10 is provided in the processing block 5 at a position near the carrier block 4. The shell unit U10 extends from the floor to the TCT module 16, and is divided into a number of cells arranged side-by-side in the vertical direction. A lifting arm A7 is provided in the vicinity of the shelf unit U10. The lifting arm A7 vertically moves a wafer W between the cells of the shelf unit U10.

A shelf unit U11 is provided in the processing block 5 at a position near the interface block 6. The shell unit U11 extends from the floor to the top of the DEV module 17, and is divided into a number of cells arranged side-by-side in the vertical direction.

The interface block 6 contains a transfer arm A8, and is connected to the exposure apparatus 3. The transfer arm A8 is configured to take a wafer W from the shelf unit U11 and transfer the wafer W to the exposure apparatus 3, and to receive a wafer U from the exposure apparatus 3 and return the wafer W to the shelf unit U11.

<Developing Unit>

Figure 4:
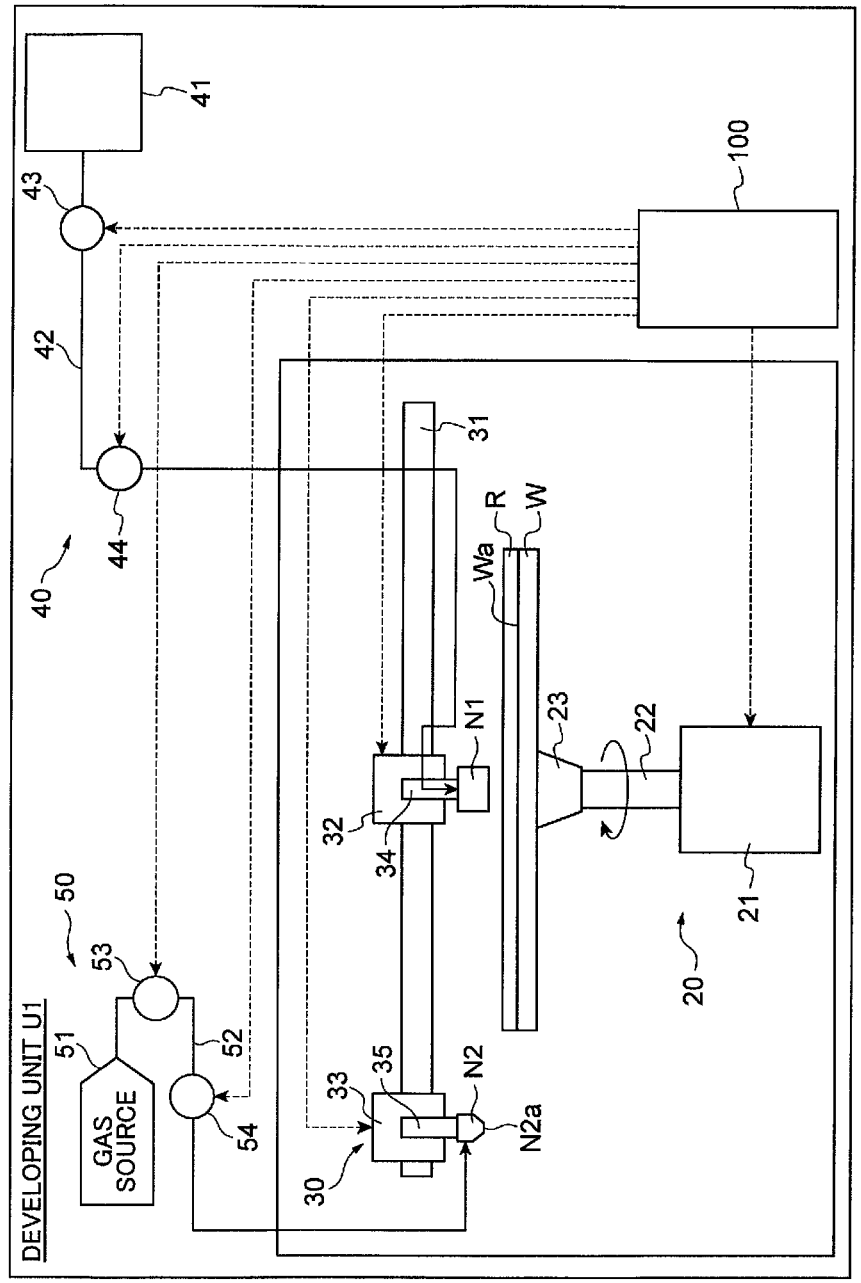
FIG. 4 is a cross-sectional view schematically showing the construction of a developing unit (developing apparatus)
Figure 5:
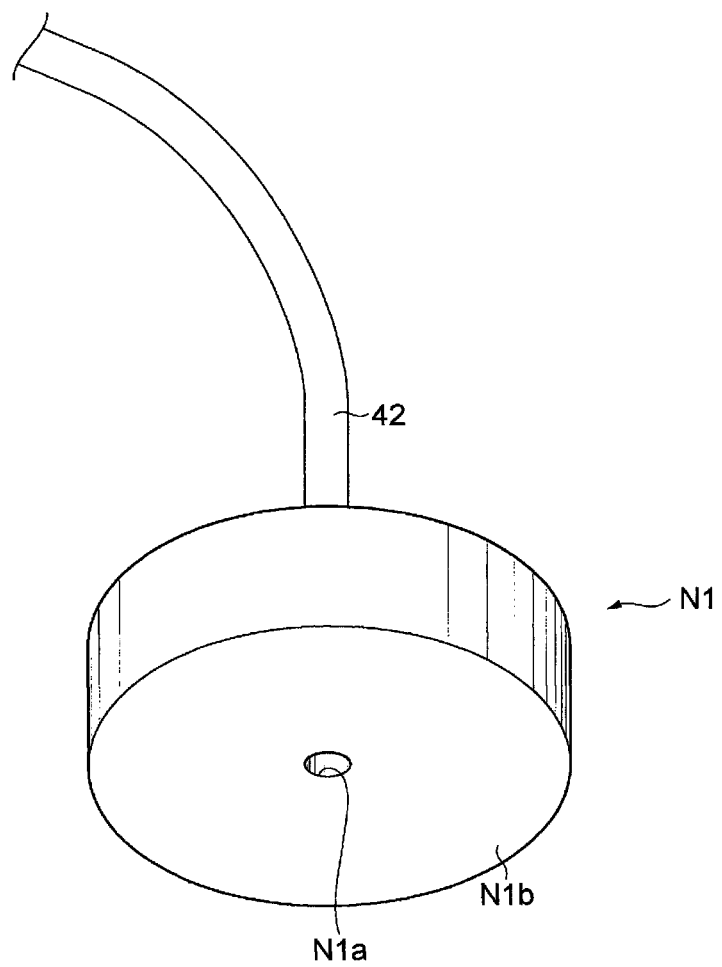
FIG. 5 is a schematic perspective view of a liquid-contact nozzle having a lower surface disposed opposite a resist film.
Figure 6:
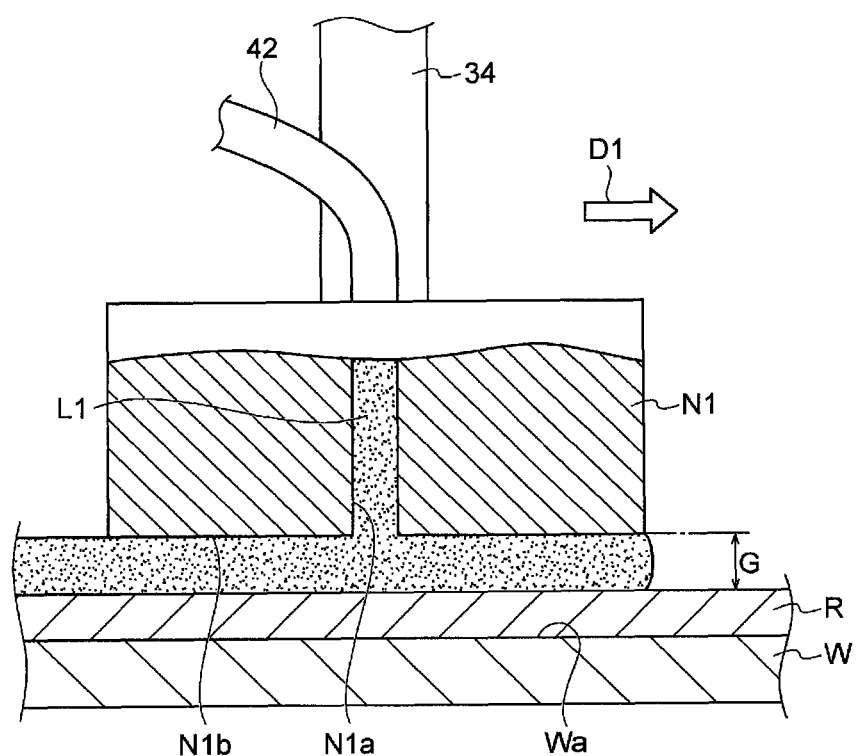
FIG. 6 is a schematic cross-sectional view illustrating supply of a developer from an ejection orifice of the liquid-contact nozzle onto a resist film.

The developing units (developing apparatuses) U1 will now be described in greater detail with reference to FIGS. 4 through 6. As shown in FIG. 4, the developing units U1 each include a rotary holder 20, a drive section 30, a developer supply section 40, a drying gas supply section 50 and a control section 100.

The rotary holder 20 includes a rotary portion 21 and a holding portion 23. The rotary portion 21 includes an upwardly-projecting shaft 22. The rotary portion 21 rotates the shaft 22 using, for example, an electric motor as a power source. The holding portion 23 is provided at the front end of the shaft 22. A wafer W, having a resist film R after exposure formed on a surface Wa, is placed in a horizontal position on the holding portion 23. The holding portion 23 holds the wafer W in an approximately horizontal position e.g. by attraction. Thus, the rotary holder 20 rotates the wafer W, held in an approximately horizontal position, about an axis (axis of rotation) perpendicular to the surface of the water W. In this embodiment the axis of rotation passes through the center of the circular wafer W, and therefore is also a central axis. In this embodiment, as shown in FIG. 4, the rotary holder 20 rotates the wafer W clockwise as viewed from above.

The drive section 30 is configured to drive a liquid-contact nozzle N1 and a gas jet nozzle N2 independently of each other. The drive section 30 includes a guide rail 31, slide blocks 32, 33 and arms 34, 35. The guide rail 31 extends in a horizontal direction above the rotary holder 20 (wafer W). The slide blocks 32, 33 are connected to the guide rail 31 so that they can move horizontally along the guide rail 31. The arm 34 is vertically movably connected to the slide block 32. The arm 35 is vertically movably connected to the slide block 33. The liquid-contact nozzle N1 is connected to the lower end of the arm 34, and the gas jet nozzle N2 is connected to the lower end of the arm 35. The drive section 30 moves the side blocks 32, 33 and the arms 34, 35 using, for example, an electric motor as a power source, thereby moving the liquid-contact nozzle N1 and the gas jet nozzle N2. In a plan view, while the liquid-contact nozzle N1 is ejecting a developer, it moves in the radial direction of the wafer W on a line perpendicular to the axis of rotation of the wafer W. On the other hand, the gas jet nozzle N2, after it is disposed at a position above the center of the wafer W, may remain in the position while it is ejecting a gas.

The developer supply section 40 includes a developer storage section 41, the liquid-contact nozzle N1, a supply pipe 42, a pump 43 and a valve 44. The developer storage section 41 stores a developer L1 (see FIG. 6). Developers are classified into positive photoresist developers and negative photoresist developers. An appropriate developer may be selected depending on the type of the resist film R. An aqueous alkaline solution may be used as a positive photoresist developer; and tetramethyl ammonium hydroxide (TMAH), for example, may be used as the alkali component of the aqueous alkaline solution. An organic solvent may be used as a negative photoresist developer.

The liquid-contact nozzle N1 is disposed above the wafer W held on the holding portion 23. FIG. 5 is a perspective view of an example of the liquid-contact nozzle N1. The ejection orifice N1a of the liquid-contact nozzle N1 faces vertically downward. The cross-sectional shape of the ejection orifice N1a is, for example, a circle preferably having a diameter of about 1 to 8 mm, more preferably about 3 to 5 mm. As shown in FIG. 5, the liquid-contact nozzle N1 has a lower surface N1b extending laterally from the ejection orifice N1a. The shape of the lower surface N1b is, for example, a circle preferably having a diameter of about 20 to 150 mm, more preferably about 30 to 50 mm. The liquid-contact nozzle N1 is connected to the developer storage section 41 by the supply pipe 42, and downwardly ejects the developer L1 supplied from the developer storage section 41, thereby supplying the developer L1 onto the surface Wa of the wafer W. Though not shown in FIG. 4, the developer supply section 40 includes, besides the liquid-contact nozzle N1, a straight nozzle N3 (replenishing developer supply nozzle) for supplying a replenishing developer to the surface of the resist film R (see FIGS. 8A-8C). The straight nozzle N3 is provided to more securely form an in-progress reaction area R2.

The pump 43 is provided in the supply pipe 42, and pressure-feeds the developer L1 from the developer storage section 41 to the liquid-contact nozzle N1. The valve 44 is provided between the liquid-contact nozzle N1 and the pump 43 in the supply pipe 42. The valve 44 starts or stops the ejection of the developer L1 from the liquid-contact nozzle N1.

The drying gas supply section 50 includes a gas source 51, the gas jet nozzle N2, a supply pipe 52, a flow rate controller 53 and a valve 54. Nitrogen gas or dry air, for example, may be used as a drying gas. A gas cylinder containing a drying gas or a pipe for transferring a drying gas, for example, may be used as the gas source 51. The ejection orifice N2a of the gas jet nozzle N2 faces vertically downward. The gas jet nozzle N2 is connected to the gas source 51 by the supply pipe 52, and downwardly jets the drying gas supplied from the gas source 51. The jetted drying gas, by its pressure, forces the developer L1 on the surface Wa to flow toward the periphery of the wafer W, and dries the developer remaining on the surface of the resist film R. This can expand a reaction-terminated area R1 from the center toward the periphery of the resist film R.

<Developing Method>

Figure 7A:
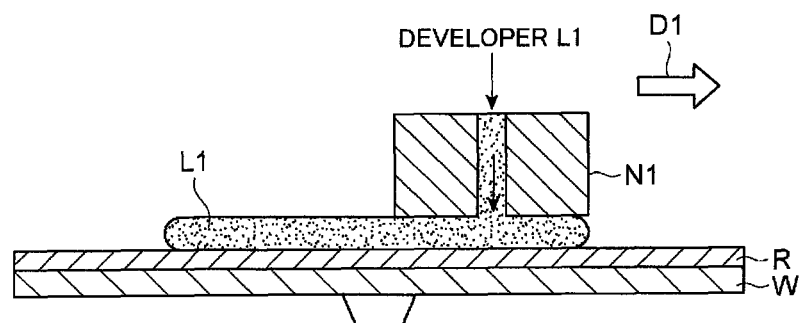
FIGS. 7A through 7C are schematic cross-sectional views illustrating the process of spreading a developer over the surface of a resist film by means of the liquid-contact nozzle.
Figure 7B:
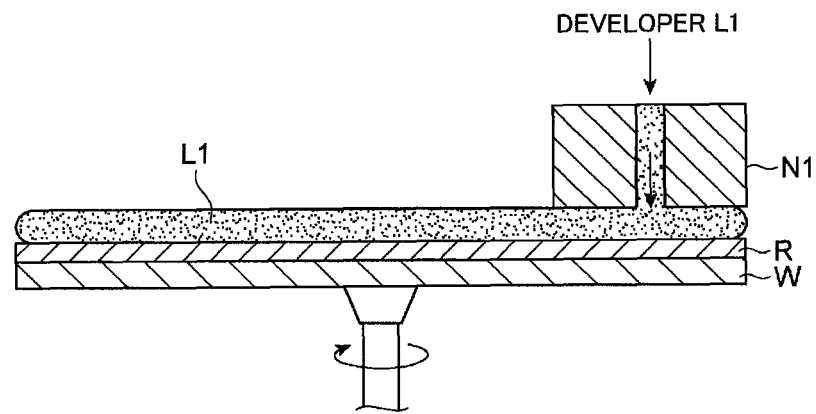
Figure 7C:
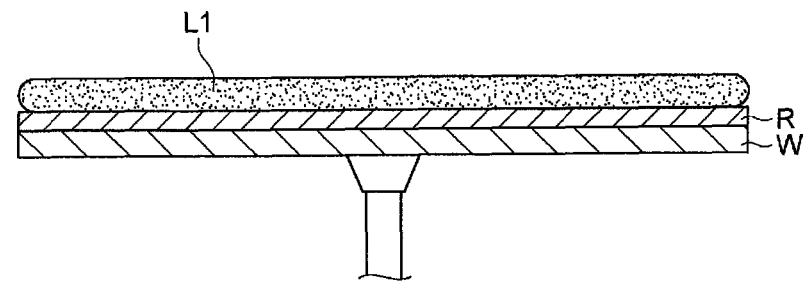
Figure 8A:
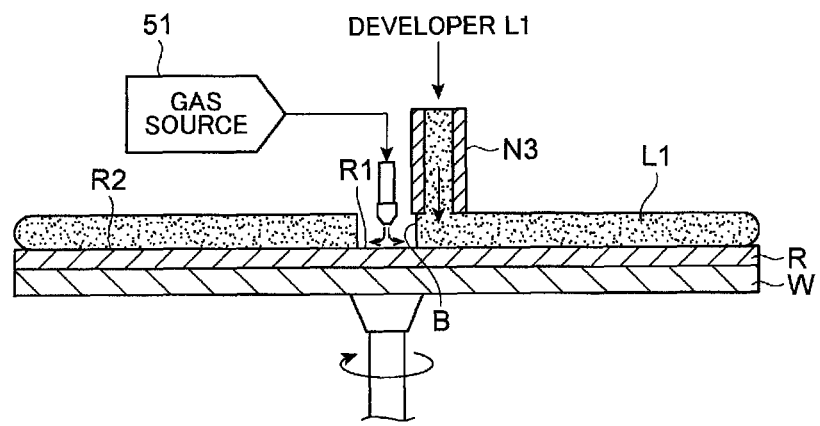
FIGS. 8A through 8C are schematic cross-sectional views illustrating the process of removing the developer from the surface of the resist film.
Figure 8B:
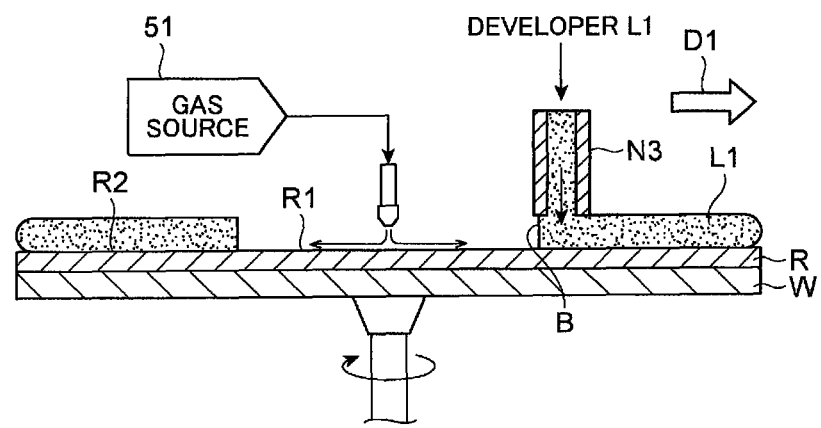
Figure 8C:
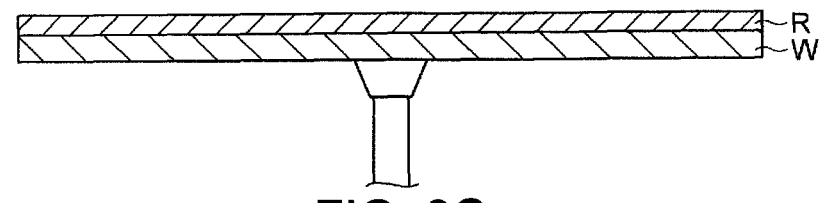

A method for developing the resist film R after exposure by using the developing unit U1 will now be described. The developing method of this embodiment is to develop the resist film R after exposure on the wafer W, thereby forming a resist pattern. The developing method comprises the following sequential steps of:

(A) supplying the developer L1 to the wafer W, thereby allowing the developer L1 to spread over the surface of the resist film R (see FIGS. 7A and 7B);

(B) reacting the resist film R with the developer L1 (see FIG. 7C); and (C) removing the developer L1 from the surface of the resist film R to terminate the reaction of the resist film R with the developer L1 (see FIGS. 8A-8C).

The liquid-contact nozzle N1 is used in the step (A). As shown in FIG. 6, the developer L1 is supplied from the ejection orifice N1a to the gap G formed between the surface of the resist film R and the lower surface N1b of the liquid-contact nozzle N1 while moving the liquid-contact nozzle N1 in a direction from the center toward the periphery of the rotating wafer W (see arrow D1 in FIGS. 6 and 7A).

Figure 9:
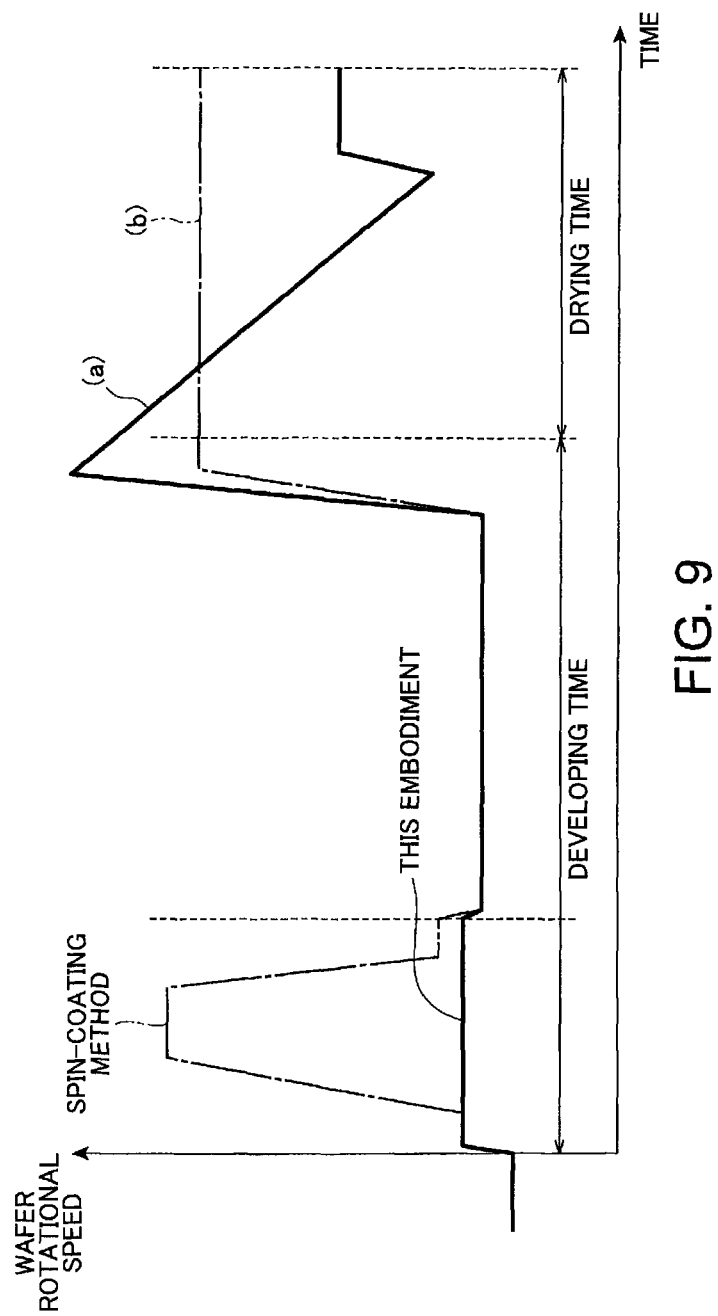
FIG. 9 is a time chart illustrating the rotational speed of a substrate during the period from the start of step (A) to the end of step (C), and the rotational speed of a substrate in a conventional spin-coating method.

The rotational speed of the wafer W in the step (A) is preferably low (see FIG. 9). The rotational speed of the wafer in the step (A) is preferably 5 to 100 rpm (revolutions per minute), more preferably 10 to 50 rpm, still more preferably 20 to 40 rpm. By rotating the wafer W at a rotational speed of not less than 5 rpm, the developer L1 can be spread over the resist film R in a sufficiently short time. On the other hand, by rotating the wafer W at a rotational speed of not more than 100 rpm, the developer L1, supplied from the liquid-contact nozzle N onto the resist film R, can be sufficiently prevented from flowing out of the periphery of the wafer W due to centrifugal force. This makes it possible to more accurately control the flow speed of the developer L1 spreading over the resist film R.

After the step (A), the step (B) is performed while rotating the wafer W at about 0 to 100 rpm. The time for the step (B) is preferably 10 to 120 seconds, more preferably 20 to 60 seconds. It is also possible to perform the step (B) while keeping the wafer W stationary.

In the step (C), the boundary B between the reaction-terminated area R1 of the surface of the resist film R, from which the developer L1 has been removed, and the in-progress reaction area R2 of the surface of the resist film R, where the reaction of the resist film R with the developer L1 is in progress, is moved from the center toward the periphery of the resist film R (see FIGS. 8A-8C).

By controlling the movement speed of the boundary B between the reaction-terminated area R1 and the in-progress reaction area R2 of the surface of the resist film R, the difference in reaction time between the center and the periphery of the resist film R can be made sufficiently small. It is to be noted in this regard that when spreading the developer over the surface of the resist film R, the developer is first supplied to the center of the resist film R, and then the liquid-contact nozzle N1 is moved in the radial direction of the wafer W to supply the developer to the periphery of the resist film R. Therefore, if the developer is removed quickly from the entire surface of the resist film R, the reaction time will be relatively long at the center of the resist film R and relatively short at the periphery. The difference in reaction time will result in a non-uniform in-place CD distribution. As described above, the difference in reaction time between the center and the periphery of the resist film R can be made sufficiently small by controlling the movement speed of the boundary B. The uniformity of the in-plane CD distribution can therefore be enhanced.

In the step (C), as shown in FIG. 8A, the reaction-terminated area R1 is first formed at the center of the resist film R. For this purpose, after completion of the step (B), a drying gas is first jetted from the gas jet nozzle N2 toward the center of the resist film R. While continuing jetting of the drying gas, the rotational speed of the wafer W is increased to a high speed. The increased rotational speed of the wafer W is preferably 1000 to 5000 rpm, more preferably 1500 to 4500 rpm, still more preferably 2000 to 4000 rpm. By rotating the wafer N at a rotational speed of not less than 1000 rpm, the boundary B of the reaction-terminated area R1, lying at the center of the resist film R, can be securely moved toward the periphery. On the other hand, by rotating the wafer W at a rotational speed of not more than 5000 rpm, the reaction of the resist film R with the developer can be sufficiently progressed in the in-progress reaction area R2.

By rotating the wafer W at a high speed in an early stage of the step (C), centrifugal force that moves the developer L1 outwardly from the center of the resist film R can be generated. The centrifugal force applied to the developer L1 increases as the reaction-terminated area R1 expands outward. Therefore, the rotational speed of the wafer W may be decreased. The rotational speed of the wafer W may be decreased either continuously or stepwise. When the boundary B reaches the periphery of the wafer W, the rotational speed of the wafer W may be about 500 to 2000 rpm (more preferably 500 to 1000 rpm).

In the step (C), the drying gas may be jetted at a flow rate of about 1 to 10 Nm$^3$/min (more preferably 2 to 8 Nm$^3$/min).

The flow rate of the drying gas may be constant during the entire step (C) or increased continuously or stepwise as the boundary B moves outward on the wafer W.

In the step (C) of this embodiment, the developer L1 is supplied from the straight nozzle N3 onto the resist film R while moving the straight nozzle N3 in a direction from the center toward the periphery of the wafer W. By supplying the developer L1 from the moving straight nozzle N3 onto the surface of the resist film R, drying of the developer L1 in the in-progress reaction area R2 can be prevented. In other words, the position to which the developer L1 is supplied from the straight nozzle N3 makes the boundary B between the reaction-terminated area R1 and the in-progress reaction area R2. Thus, the movement speed of the boundary B can be controlled by controlling the movement speed of the straight nozzle N3.

The control section 100 provided in each developing unit U1 controls the rotary holder 20, the liquid-contact nozzle N1, the drive section 30, the developer supply section 40, etc., and executes the step (A), the step (B) and the step (C) in this order. The control section 100 controls each developing unit U1 so that in the step (A), the developer L1 is supplied from the ejection orifice N1$a$ to the gap C formed between the surface of the resist film R and the lower surface N1$b$ of the liquid-contact nozzle N1 while moving the liquid-contact nozzle N1 in a direction from the center toward the periphery of the rotating wafer W. Further, the control section 100 controls the developing unit U1 so that in the step (C), the boundary B between the reaction-terminated area R1 of the surface of the resist film R, from which the developer L1 has been removed, and the in-progress reaction area R2 of the surface of the resist film R, where the reaction of the resist film R with the developer L1 is in progress, is moved from the center toward the periphery of the resist film R.

Figure 10A:
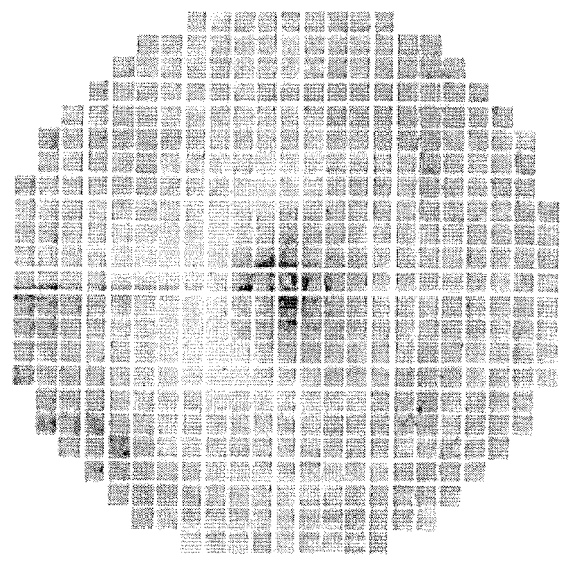
FIG. 10A shows an example of the in-plane CD distribution of a resist formed by a developing method according to the present invention.
Figure 10B:
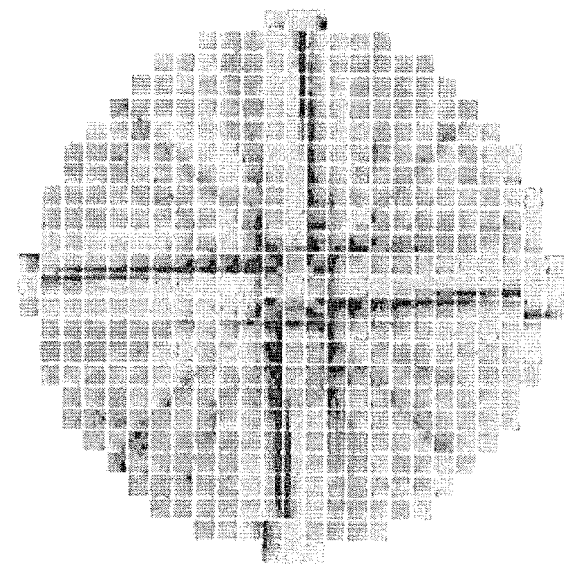
FIG. 10B shows an example of the in-plane CD distribution of a resist formed by a conventional spin-coating method.
Figure 11A:
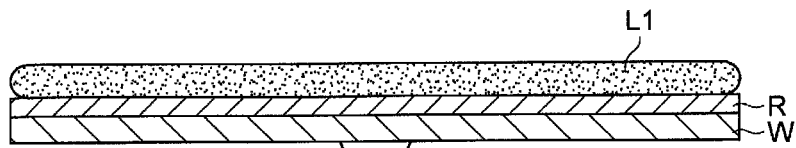
FIGS. 11A through 11E are schematic cross-sectional views illustrating the process of removing a developer from the surface of a resist film by using a rinsing liquid supply nozzle.
Figure 11B:
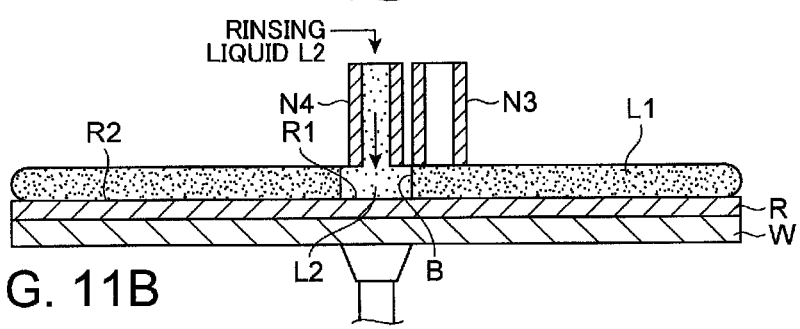
Figure 11C:
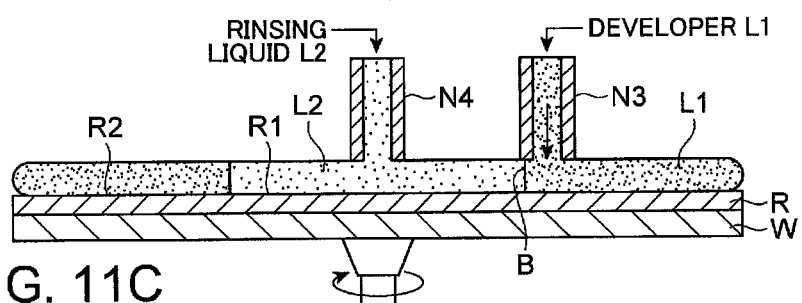
Figure 11D:
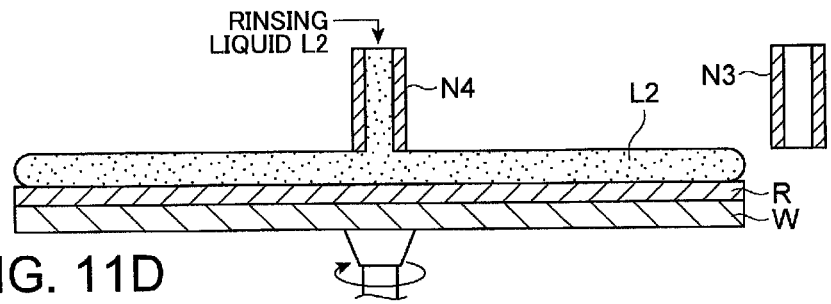
Figure 11E:
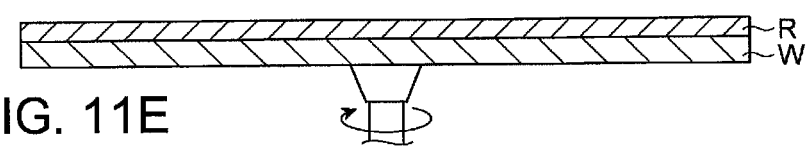
Figure 12A:
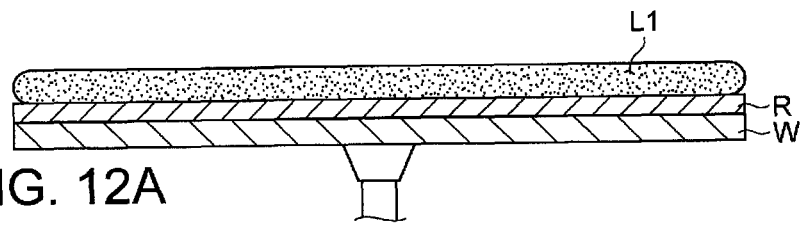
FIGS. 12A through 12D are schematic cross-sectional views illustrating the process of removing a developer from the surface of a resist film by using a suction nozzle.
Figure 12B:
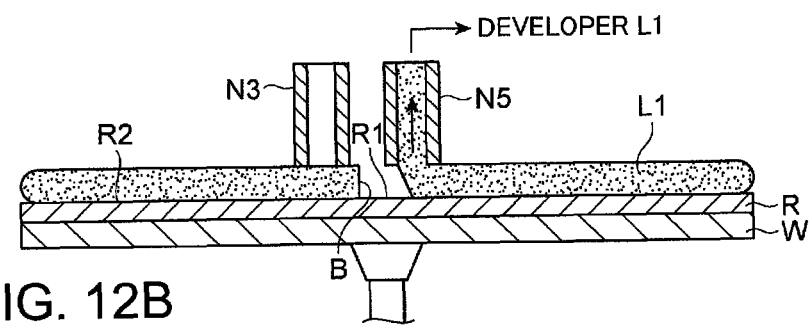
Figure 12C:
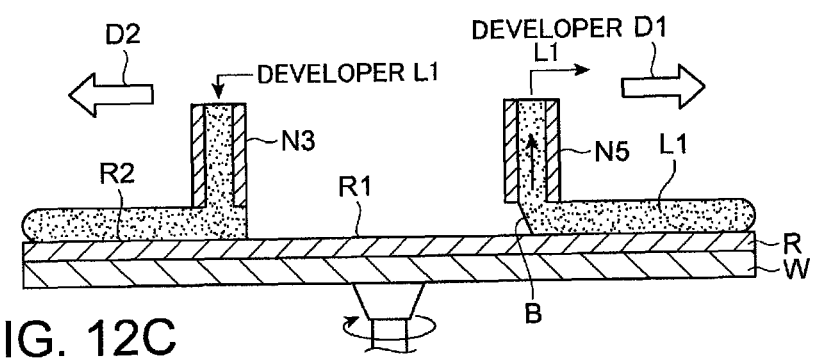
Figure 12D:
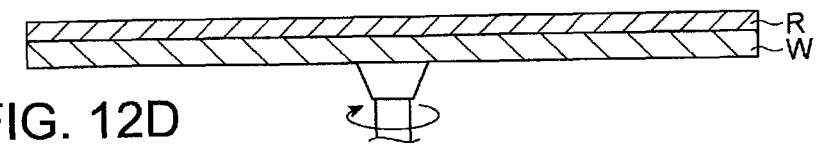

FIG. 10A shows an example of the in-plane CD distribution of a resist formed by the above-described developing method. 3σ of the in-plane CD distribution of this example was found to be 0.64 nm. FIG. 10B shows an example (comparative example) of the in-plane CD distribution of a resist formed by supplying a developer to a resist film by a conventional spin-coating method. 3σ of the in-plane CD distribution of this comparative example was found to be 1.27 nm. As shown in FIG. 10B, the CD distribution of the comparative resist formed by the conventional spin-coating method has a characteristic feature, a plurality of lines extending radially from the center of the wafer, which is considered to be caused by the flow of the developer on the wafer. On the other hand, such a feature is not found in the CD distribution of the resist formed by the developing method of the present invention. The in-plane CD values were measured by using a length-measuring SEM (manufactured by Hitachi High-Technologies Corporation).

While the present invention has been described with reference to preferred embodiments, it will be understood that various changes and modifications may be made therein within the scope of the inventive concept as expressed herein. For example, though in the above-described embodiment the reaction-terminated area R1 is formed in the step (C) by using the gas jet nozzle N2, it is possible to form the reaction-terminated area R1 at the center of the resist film R by centrifugal force due to rotation of the wafer W without using a gas jet nozzle. Also in this case, the developer L1 may be supplied from the straight nozzle N3 onto the resist film R while moving the straight nozzle N3 in a direction from the center toward the periphery of the wafer W. Instead of jetting the drying gas from the gas jet nozzle N2 in the step (C), a rinsing liquid L2 may be supplied to the resist film R to form the reaction-terminated area R1. Pure water or an aqueous solution containing a surfactant, for example, may be used as the rinsing liquid L2. Thus, as shown in FIG. 11, the rinsing liquid L2 is supplied onto the resist film R from a rinsing liquid supply nozzle N4 disposed above the center of the resist film R and, at the same time, the developer L1 is supplied from the straight nozzle N3 onto the resist film R while moving the straight nozzle N3 in a direction from the center toward the periphery of the wafer W.

Alternatively, as shown in FIGS. 12A-12D, it is possible to suck up the developer L1 on the resist film R through a suction nozzle N5 disposed above the center of the resist film R. Thus, the suction nozzle N5 is moved in a direction from the center toward the periphery of the wafer W (the direction of arrow D1 in FIGS. 12A-12D) and, at the same time, the developer L1 is supplied from the straight nozzle N3 onto the resist film R while moving the straight nozzle N3 in a direction from the center toward the periphery of the wafer W (the direction of arrow D2 in FIGS. 12A-12D). By moving the suction nozzle N5 and the straight nozzle N3 in different directions, the developing liquid L1 ejected from the straight nozzle N3 can be prevented from being immediately sucked by the suction nozzle N5.

Figure 13:
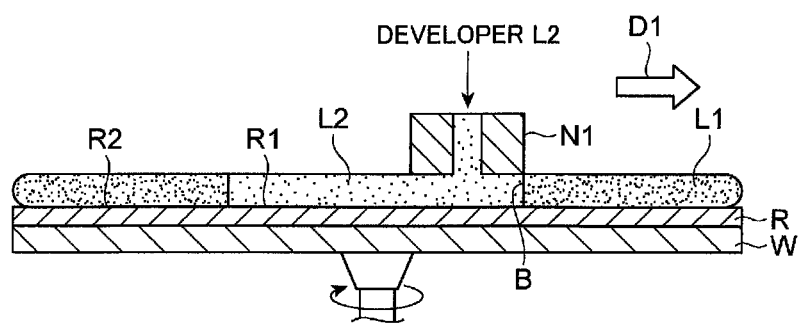
FIG. 13 is a schematic cross-sectional view illustrating supply of a rinsing liquid in step (C) as performed by using a liquid-contact nozzle.

In the embodiment shown in FIGS. 11A-11E, the rinsing liquid supply nozzle N4, which is a straight nozzle, is used as a nozzle to supply the rinsing liquid L2 onto the resist film R; however, it is possible to use a liquid-contact nozzle instead of the straight nozzle. FIG. 13 is a diagram showing a variation of the step (C) of the above-described embodiment and illustrating supply of the rinsing liquid L2 as performed by using the liquid-contact nozzle N1.

In the above-described embodiment and variations, the movement of the boundary B is controlled by supplying the developer L1 onto the resist film R in the step (C). However, depending on the viscosity of the developer L1, etc., the movement speed of the boundary B can sometimes be sufficiently controlled by adjusting the rotational speed of the wafer W. In such a case, it is possible not to supply the developer L1 onto the resist film R in the step (C).

According to the above-described embodiment and variations, a resist having an excellent uniformity of CD distribution can be formed by controlling the position on a resist film R to which a developer is supplied and the movement speed of the developer spreading over the resist film R in the step (A), and controlling the position on the resist film R from which the developer is removed and the movement speed of the position in the step (C).

DESCRIPTION OF THE REFERENCE NUMERALS 1 substrate processing system
2 coating/developing apparatus
20 rotary holder
30 drive section
40 developer supply section
50 drying gas supply section
51 gas source
100 control section
B boundary
G gap
L1 developer
L2 rinsing liquid.
N1 liquid-contact nozzle
N1a ejection orifice
N1b lower surface
N2 gas jet nozzle
N2a ejection orifice
N3 straight nozzle (replenishing developer supply nozzle)
N4 rinsing liquid supply nozzle
N5 suction nozzle
R resist film
R1 reaction-terminated area
R2 in-progress reaction area
U1 developing unit (developing apparatus)
W wafer (substrate)
Wa surface

What is claimed is:

1. A developing method for developing a resist film after exposure on a substrate surface to form a resist pattern, said method comprising the sequential steps of:
   (A) supplying a developer to the rotating substrate held in a horizontal position, thereby allowing the developer to spread over the surface of the resist film;
   (B) reacting the resist film with the developer; and
   (C) removing the developer from the surface of the resist film to terminate the reaction of the resist film with the developer, wherein in the step (A), a liquid-contact nozzle, having an ejection orifice for the developer and a lower surface extending laterally from the ejection orifice and disposed opposite the resist film, is used, and the developer is supplied from the ejection orifice to the gap formed between the surface of the resist film and the lower surface of the liquid-contact nozzle while moving the liquid-contact nozzle in a direction from the center toward the periphery of the rotating substrate, and wherein in the step (C), a boundary between a reaction-terminated area of the surface of the resist film, from which the developer has been removed, and an in-progress reaction area of the surface of the resist film, where the reaction of the resist film with the developer is in progress, is moved from the center toward the periphery of the resist film,
   wherein in the step (C), a developer is supplied onto the resist film from a nozzle moving in a direction from the center toward the periphery of the resist film so that the boundary moving from the center toward the periphery is formed, and the reaction-terminated area is formed by supplying a drying gas to the center of the resist film from above.

2. The developing method according to claim 1, wherein the rotational speed of the substrate in the step (A) is 5 to 100 rpm.

3. The developing method according to claim 1, wherein the substrate is rotated at 1000 to 5000 rpm when forming the reaction-terminated area at the center of the resist film in the step (C), and the rotational speed of the substrate is decreased as the boundary moves toward the periphery of the substrate.

4. The developing method according to claim 1, wherein the speed of the liquid-contact nozzle moving in the radial direction of the substrate in the step (A) is in the range of 5 to 100 mm/sec, and the speed of the boundary moving in the radial direction of the substrate in the step (C) is in the range of 5 to 100 mm/sec.

5. The developing method according to claim 1, wherein in the step (B), the wafer W is kept stationary.

6. The developing method according to claim 1, wherein the cross-sectional shape of the ejection orifice is a circle having a diameter of about 1 to 8 mm and the shape of the lower surface of the ejection orifice is a circle having a diameter of about 30 to 50 mm.

7. A non-transitory computer-readable storage medium storing a program for causing a developing apparatus to perform the developing method according to claim 1.

* * * * *